United States Patent [19]

Sato et al.

[11] 3,965,371

[45] June 22, 1976

[54] TEMPERATURE COMPENSATED VIDEO SIGNAL PROCESSING CIRCUIT WITH A VIDEO SIGNAL CLIPPING DEVICE

[75] Inventors: Itsuzo Sato; Kikuo Saito, both of Yokohama, Japan

[73] Assignee: Tokyo Shibaura Electric Co., Ltd., Kawasaki, Japan

[22] Filed: May 21, 1975

[21] Appl. No.: 579,702

[30] Foreign Application Priority Data
May 30, 1974 Japan.............................. 49-61164

[52] U.S. Cl.............................. 307/237; 328/171; 330/23
[51] Int. Cl.²............................................. H03K 5/08
[58] Field of Search...................... 330/11, 23, 30 D; 178/DIG. 26, 7.3 DC, 7.5 DC; 307/237; 328/171

[56] References Cited
UNITED STATES PATENTS
3,760,196  9/1973   Nomoto et al.................. 328/171 X Primary Examiner—James B. Mullins
Attorney, Agent, or Firm—Oblon, Fisher, Spivak, McClelland & Maier

[57] ABSTRACT

A temperature dependent variation of the voltage drop across a clipping pn junction device which causes the clipping voltage level of a DC restored video signal to vary is compensated by the base-to-emitter voltage variation of an emitter follower transistor having substantially the same temperature characteristic as the clipping pn junction device. A variation in the DC level of the DC restored video signal resulting from the base-to-emitter voltage variation of the emitter follower transistor is compensated by a feed back type differential amplifier whose output is fed back to one input thereof through an emitter follower transistor and a pn junction device.

4 Claims, 1 Drawing Figure

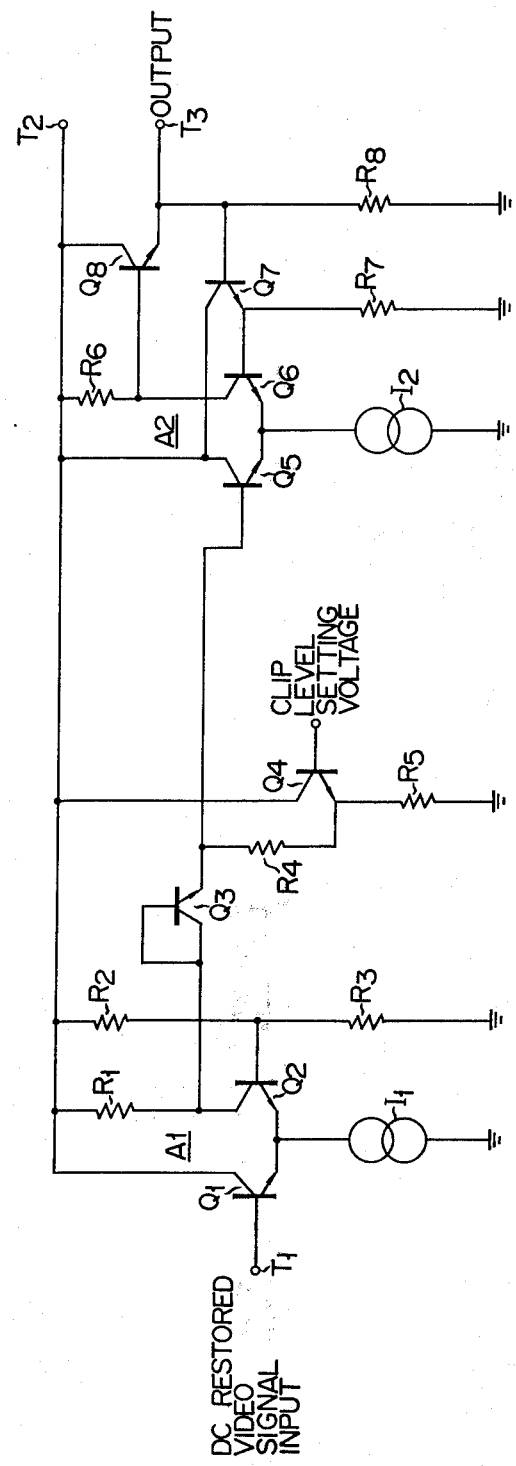

TEMPERATURE COMPENSATED VIDEO SIGNAL PROCESSING CIRCUIT WITH A VIDEO SIGNAL CLIPPING DEVICE

This invention relates to a video signal processing circuit and in particular to a video signal processing circuit with a video signal clipping device.

In a DC coupled video signal processing circuit having a clipping diode for clipping a DC restored video signal, a clipping voltage level is varied by temperature dependent variation of the forward voltage drop across the clipping diode. Such a variation in the level of voltage can be neglected by making the amplitude level of the video signal relatively great. However, such a method can not be utilized in a monolithic bipolar integrated circuit in which a signal of great amplitude can not be processed.

The object of this invention is to provide a DC coupled video signal processing circuit suitable for integrated circuit version, which is capable of compensating variation in the clipping level of a DC restored video signal which results from the variation of forward voltage drop across a clipping diode with temperature and capable of compensating variation in the DC level of the DC restored video signal which is caused by the compensation for variation in the clipping level of the video signal.

According to this invention there is provided a video signal processing circuit comprising a first transistor differential amplifier having an input and output, the input of the first transistor differential amplifier being connected to receive a DC restored video signal; a clipping pn junction device coupled to the output of the first transistor differential amplifier; a first emitter follower transistor whose base is connected to a bias voltage source to apply a predetermined bias voltage to the clipping pn junction device by the emitter output of said first emitter follower transistor; and a second transistor differential amplifier including first and second transistors each having an emitter, collector and base and connected in common emitter configuration, the base of the first transistor being coupled to the output of the clipping pn junction, a load resistor coupled to the collector of the second transistor, a second emitter follower transistor whose base is coupled to the collector of the second transistor, and a second pn junction device coupled between the emitter of said second emitter follower transistor and the base of the second transistor, the polarity relation of the second pn junction device to the base of the second transistor being the same as that of the clipping pn junction device to the base of the first transistor.

This invention will be further described by way of example by reference to the accompanying drawing which shows schematically a video signal processing circuit according to one embodiment of this invention.

In the drawing, transistors $Q_1$ and $Q_2$ are connected in common emitter configuration to constitute a first differential amplifier $A_1$. The emitters of the transistors $Q_1$ and $Q_2$ are grounded through a constant current source $I_1$. The collector of transistor $Q_1$ is connected to a DC power supply terminal $T_2$, while the collector of transistor $Q_2$ is connected through a load resistor $R_1$ to the DC power supply terminal $T_2$. The base of transistor $Q_2$ is connected to a junction between resistors $R_1$ and $R_3$ which are series connected between the DC power supply terminal $T_2$ and ground. The base of transistor $Q_1$ is connected to an input terminal $T_1$ where a DC restored video signal is received.

A clipping pn junction device such as a diode-connected transistor $Q_3$ (with the collector shorted to the base) is DC coupled to the output of the first differential amplifier $A_1$ i.e. a junction between the load resistor $R_1$ and the collector of transistor $Q_2$. That is, the collector and base of transistor $Q_3$ are coupled to the output of the first differential amplifier $A_1$.

A transistor $Q_4$ has the collector connected to the DC power supply terminal $T_2$ and the emitter grounded through a load resistor $R_5$ i.e. is connected in emitter follower configuration. The emitter of transistor $Q_4$ is connected through a resistor $R_4$ to the emitter of transistor $Q_3$ and the base of transistor $Q_4$ is connected to a clip level setting voltage source.

Transistors $Q_5$ and $Q_6$ are connected in common emitter configuration to constitute a second differential amplifier $A_2$. The emitters of transistors $Q_5$ and $Q_6$ are grounded through a constant current source $I_2$. The collector of transistor $Q_5$ is connected to the DC power supply terminal $T_2$ while the collector of transistor $Q_6$ is connected through a load resistor $R_6$ to the DC power supply terminal $T_2$. One input of the second differential amplifier $A_2$ i.e. the base of transistor $Q_5$ is DC coupled to the emitter of clipping transistor $Q_3$.

To the output of the second differential amplifier $A_2$ i.e. a junction between the load resistor $R_6$ and the collector of transistor $Q_6$ is DC coupled the base of a transistor $Q_8$ which has the collector connected to the DC power supply terminal $T_2$ and the emitter grounded through a load resistor $R_8$ i.e. is connected in emitter follower configuration. The emitter of the transistor $Q_8$ is coupled to an output terminal $T_3$. To the emitter of transistor $Q_8$ is DC coupled the base of a transistor $Q_7$ which has the collector connected to the DC power supply terminal $T_2$ and the emitter grounded through a load resistor $R_7$ i.e. is connected in emitter follower configuration. The emitter of transistor $Q_7$ is DC coupled to the other input of the second differential amplifier $A_2$ i.e. the base of transistor $Q_6$.

The operation of the above-mentioned circuit will now be explained below.

The DC restored video input signal is amplified by the first differential amplifier $A_1$ to generate an amplified output whose block level is clipped by the clipping transistor $Q_3$.

The clip level of the video signal is determined by the emitter voltage of the emitter follower transistor $Q_4$ operative to apply a bias voltage to the clipping transistor $Q_3$. The emitter voltage is lower than the clip level setting voltage applied to the base of transistor $Q_4$, by the base-to-emitter voltage of the transistor $Q_4$. The clip level is controlled by the voltage applied to the base of transistor $Q_4$. When a video signal having a voltage level greater than the clip level is applied to the base of transistor $Q_5$, it appears at the collector of transistor $Q_6$. The output video signal may be DC coupled from the output terminal $T_3$ to a utilization circuit, for example, a color coder, through the emitter follower transistor $Q_8$ having a low output impedance. The output video signal is also fed back to the base of transistor $Q_6$ through the emitter follower transistor $Q_7$. That is, since the output of the second differential amplifier $A_2$ is fed back to the input terminal thereof through the emitter follower transistors $Q_7$ and $Q_8$, the second differential amplifier $A_2$ has a gain of unity. The feedback type differential amplifier having a gain of unity performs an important function in the invention.

Now consider the case where the base-to-emitter voltage of the clipping transistor $Q_3$ is varied by the change in ambient temperature.

The clip level of the video signal tends to be varied by the variation of the base-to-emitter voltage of the clipping transistor $Q_3$. Since, however, the emitter voltage of the transistor $Q_4$ which is lower than the clip level setting voltage by the base-to-emitter voltage of the transistor $Q_4$ is applied through the resistor $R_4$ to the emitter of clipping transistor $Q_3$, the variation of the clip level is cancelled. Where use is made, as the transistor $Q_3$ and $Q_4$, of matched pair having a substantially identical temperature characteristic, the base-to-emitter voltages $V_{BE}$ of both the transistors $Q_3$ and $Q_4$ likewise vary. In consequence, the voltage at the emitter of transistor $Q_4$ varies with the same magnitude as, and in a direction opposite to, the base-to-emitter voltage of the clipping transistor $Q_3$ with respect to the clip level setting voltage taken as a reference, permitting the base-to-emitter voltage variations of the transistors $Q_3$ and $Q_4$ to be cancelled with respect to each other. This means that the clip level of the video signal is maintained constant irrespective of the temperature variation.

It will be evident, however, that the emitter voltage of the clipping transistor $Q_3$ i.e. the base voltage of the transistor $Q_5$ is caused to be varied by the above-mentioned compensation for the clip level variation i.e. by the variation of the base-to-emitter voltage $V_{BE}$ of the transistor $Q_4$. This means, the DC voltage level of the video signal varies with change in temperature.

The DC voltage level variation of the video signal can be compensated as follows.

Let the base voltage of the transistor $Q_5$ be represented by $-V_{BE}$ (in this case, consideration is restricted only to its variation component). It is because that the base voltage of the transistor $Q_5$ is lower than the predetermined clip level setting voltage by the base-to-emitter voltage $V_{BE}$ of the transistor $Q_4$ or the variation voltage component. In this case, the emitter voltage of the transistor $Q_5$ is lower than the base voltage thereof by the base-to-emitter voltage $V_{BE}$ of transistor $Q_5$, i.e. is $-2V_{BE}$. On the other hand, the base voltage of the transistor $Q_6$ is higher than the emitter voltage thereof by the emitter-to-base voltage $V_{BE}$ of transistor $Q_6$ i.e. is $-V_{BE}$. The emitter voltage of the transistor $Q_7$ is the same as the base voltage of the transistor $Q_6$. Consequently, the base voltage of the transistor $Q_7$ is higher than the emitter voltage thereof by the base-to-emitter voltage $V_{BE}$ of transistor $Q_7$. From the above explanation it will be understood that the variation component $V_{BE}$ disappears at the base of transistor $Q_7$.

Since the base of transistor $Q_7$ is connected to the output terminal $T_3$, it is possible to obtain an output video signal free from any variation of a DC voltage level which would occur due to the variation of the base-emitter voltage of the emitter follower transistor $Q_4$ adapted to compensate for the variation of the clip level. The output video signal may be DC coupled to a next stage circuit such as, for example, a color coder, the feature of which constitutes an outstanding advantage of this invention.

According to this invention the emitter output of the emitter follower transistor $Q_8$ may be coupled through a pn junction to the base of transistor $Q_6$. For this reason, the emitter follower transistor $Q_7$ may be replaced by a pn junction device such as a diode or a diode-connected transistor. However, the result of an experiment reveals that, for the purpose of enhancing frequency characteristic of the circuit, it is desirable to use the emitter follower configuration as shown in the drawing which couples the emitter of transistor $Q_8$ to the base of transistor $Q_6$ by the base-emitter pn junction.

As, with a monolithic integrated circuit, transistors of very uniform characteristics (including a temperature characteristic) can be formed on a semiconductor substrate, the temperature characteristic of the clipping transistor $Q_3$ can be made equal to that of the compensating transistor $Q_4$. Furthermore, the temperature compensated video signal processing circuit according to this invention is very suitable for integrated circuit version, since the video signal need not be treated with a great amplitude.

What we claim is:

1. A video signal processing circuit comprising:
   a first transistor differential amplifier having an input and output, the input of said first transistor differential amplifier being connected to receive a DC restored video signal;
   a clipping pn junction device coupled to the output of said first transistor differential amplifier;
   a first emitter follower transistor whose base is connected to a bias voltage source to apply a predetermined bias voltage to said clipping pn junction device by an emitter output of said first emitter follower transistor; and
   a second transistor differential amplifier including first and second transistors each having an emitter collector and base and connected in common emitter configuration, the base of said first transistor being coupled to the output of said clipping pn junction, a load resistor coupled to the collector of said second transistor, a second emitter follower transistor whose base is coupled to the collector of said second transistor, and a second pn junction device coupled between the emitter of said second emitter follower transistor and the base of said second transistor, the polarity relation of said second pn junction device to the base of said second transistor being the same as that of said clipping pn junction device to the base of said first transistor.

2. A video signal processing circuit according to claim 1 in which said clipping pn junction device is a diode-connected transistor whose collector and base are connected with each other.

3. A video signal processing circuit according to claim 1 in which said second pn junction device comprises an emitter follower transistor whose base is coupled to the emitter of said second emitter follower transistor and whose emitter is coupled to the base of said second transistor.

4. A video signal processing circuit according to claim 1 in which said clipping pn junction device is a diode-connected transistor whose collector and base are connected with each other, said diode-connected transistor having the collector and base coupled to the output of said first differential amplifier and an emitter coupled to the base of said first transistor of said second differential amplifier, and the emitter of said first emitter follower transistor.

* * * * *